United States Patent [19]

Kanzaki

[11] Patent Number: 5,579,346
[45] Date of Patent: Nov. 26, 1996

[54] AUTOMATIC FREQUENCY CONTROL METHOD AND CIRCUIT FOR USE IN A DELAY DETECTION TYPE DEMODULATOR

[75] Inventor: Kiyoko Kanzaki, Kamakura, Japan

[73] Assignee: Kabushiki Kaisha Toshiba, Kawasaki, Japan

[21] Appl. No.: 373,425

[22] Filed: Jan. 17, 1995

[30] Foreign Application Priority Data

Jan. 19, 1994 [JP] Japan .................................. 6-004200

[51] Int. Cl.⁶ .................................................. H04L 27/06
[52] U.S. Cl. .......................... 375/344; 375/327; 329/307; 455/192.2
[58] Field of Search .................................. 375/344, 329, 375/331, 332, 330, 327, 375, 376; 329/304, 307, 308; 455/136, 164.1, 192.2

[56] References Cited

U.S. PATENT DOCUMENTS

| | | | |
|---|---|---|---|
| 4,253,184 | 2/1981 | Gitlin et al. ............................ | 375/232 |
| 4,527,278 | 7/1985 | Deconche et al. ........................ | 375/344 |
| 4,879,728 | 11/1989 | Tarallo ................................... | 375/330 |
| 4,943,982 | 7/1990 | O'Neil, II et al. ....................... | 375/344 |
| 5,157,694 | 10/1992 | Iwasaki et al. ............................ | 375/327 |
| 5,379,323 | 1/1995 | Nakaya ................................ | 329/304 |
| 5,386,239 | 1/1995 | Wang et al. ........................... | 375/266 |
| 5,400,366 | 3/1995 | Iwamatsu ................................ | 375/344 |

Primary Examiner—Stephen Chin
Assistant Examiner—Don Vo
Attorney, Agent, or Firm—Banner & Witcoff, Ltd.

[57] ABSTRACT

A delay detection is performed to baseband signals subjected to an orthogonal demodulation to obtain a delay detection output and a frequency error is found from the delay detection output. The frequency error is converted into a control frequency which is accumulated to generate a phase rotation φ which is used to rotate the input baseband signals before being subjected to the delay detection, thereby to perform frequency correction. By providing filters downstream of a phase rotation circuit and upstream of a delay detection circuit, automatic frequency control can be realized without performance deterioration.

5 Claims, 9 Drawing Sheets

AUTOMATIC FREQUENCY CONTROL METHOD AND CIRCUIT FOR USE IN A DELAY DETECTION TYPE DEMODULATOR

BACKGROUND OF THE INVENTION

1. Field of the Invention

The present invention relates to a method of and a circuit for an automatic frequency control for stabilizing a receive frequency which is applied to a delay detection type radio communication system such as a digital cordless telephone system which uses a baseband signal essential to the delay detection.

2. Description of the Related Art

To stabilize a receive operation in a delay detection type radio communication system, automatic control of frequency is performed. An example of the automatic frequency control will be briefly explained by referring to FIG. 13.

FIG. 13 illustrates a demodulator of a conventional digital cordless telephone system having a delay detection function for a ($\pi/4$) shift QPSK (quadrature phase shift keying) signal. In the demodulator, a signal ($\pi/4$QPSK modulated signal) input through an input terminal 701 is mixed, by mixers 702 and 703, with frequency signals having $\pi/2$ phase difference supplied from a local oscillator 704 through a $\pi/2$ phase difference branching filter 705. Thus, the input signal from the input terminal 701 is subjected to an orthogonal modulation and the mixers 702 and 703 output baseband signals I and Q.

The baseband signals I and Q are converted into digital signals by A/D converters 706 and 707 and then transmitted to a delay detection circuit 710 for preforming delay detection via filters 708 and 709. An output of the delay detection circuit 710 is transmitted to a frequency error detection circuit 711. An output of the delay detection circuit 710 is also transmitted to the next stage of the cordless telephone system, such as a data decoding circuit.

The frequency error detection circuit 711 detects a frequency error from the output of the delay detection circuit 710. The detected frequency error is fed to the local oscillator 704 through a D/A converter 712 so as to control the oscillation frequency of the local oscillator 704, thereby performing the frequency correction of the receive signal.

Conventional radio communication systems typically perform the automatic frequency control (AFC) by controlling the frequency of a local oscillator of the receiving unit in the above-described manner.

It is to be noted that the local oscillator is generally controlled with an analog signal, and thus when a digital control signal is supplied, it is necessary to convert the digital signal into an analog signal by a D/A converter such as the D/A converter 712 of FIG. 13.

In the conventional AFC described above, it is necessary to always perform a fine step control to the local oscillator by an analog signal. Therefore, the AFC is disadvantageous in that (a) a circuit scale becomes large and (b) a production cost becomes high.

Further, in a multiplex system using the above-described step control method, since the response to frequency switching for each channel is slow, (c) time response is too slow to catch up with the operation of a time multiplex system such as a time division multiple access (TDMA) system and a time division duplex (TDD) system.

In order to eliminate these disadvantages, there is a known method in which a correction is performed to a signal obtained through delay detection by a digital signal processing circuit. Since this method does not require the step control, this method is suitable for realizing a fast AFC control required in the DTMA and TDD systems.

This method, however, has a disadvantage that, since the correction control must be carried out after filtering and delay detecting operations, (d) a desired spectrum is filtered out by the filtering and thus performance is remarkably degraded.

SUMMARY OF THE INVENTION

In view of these disadvantages of the conventional AFC circuit, it is accordingly an object of the present invention to provide an AFC circuit capable of suppressing the increases of the circuit scale and the production cost caused by the fine step control of a local oscillator with an analog signal.

Another object of the invention is to provide an AFC circuit capable of increasing a response speed to a frequency switching when used in time multiplex systems such as a TDMA system and a TDD system.

A further object of the invention is to provide an automatic frequency control method capable of preventing the degradation of performance caused by the removal of desired spectra through filtering.

In accordance with an aspect of the present invention, the above objects can be attained by providing an AFC circuit comprising delay detection means for performing a delay detection to baseband signals obtained by an orthogonal demodulation performed to a multi-value phase modulation signal; frequency error detection means for detecting a frequency error from an output of the delay detection means; control frequency conversion means for converting the frequency error detected by the frequency error detection means into a control frequency; and phase adjustment means provided in an input path of the delay detection means, for receiving the control frequency fed back from the control frequency conversion means to perform a phase adjustment of the baseband signals at a timing after the orthogonal demodulation of the baseband signals and before the delay detection by the delay detection means.

In accordance with another aspect of the present invention, there is provided an AFC circuit provided in a receive demodulator for detecting original modulation multi-value information from baseband signals obtained by performing an orthogonal demodulation to a multi-value phase modulation signal, comprising phase rotation means for performing a phase rotation to the baseband signals obtained by the orthogonal demodulation; delay detection means for performing a delay detection to the baseband signals after being subjected to the phase rotation; frequency error detection means for detecting a frequency error from a delay detection pattern by the delay detection means; loop filter means for receiving the frequency error and generating a control frequency from the frequency error; and variable frequency oscillation means for accumulating the control frequency and supplying the accumulated control frequency to the phase rotation means as an instantaneous phase value for the phase rotation of the baseband signals.

In accordance with another aspect of the present invention, there is provided an automatic frequency control method comprising a delay detection step of performing a delay detection to baseband signals obtained by an orthogonal demodulation performed to a multi-value phase modulation signal; a frequency error detection step of detecting a frequency error from an output of the delay detection step; a control frequency generation step of generating a control frequency from the frequency error detected by the frequency error detection step; and a frequency error correction step of feeding back the control frequency generated by the control frequency generation step to correct the frequency error of the baseband signals inputted to the delay detection step.

When the oscillation frequency of the local oscillator of the receiver is controlled to stabilize the frequency as in the conventional AFC circuit, this requires the fine step control of the local oscillator based on the analog signal, which incurs not only increase in the circuit scale and production cost but also deterioration in the time response in time multiplexing systems such as TDMA and TDD systems.

In the present invention, a frequency error with respect to an ideal judgement point for each symbol is detected from the delay detection output of the baseband signal subjected to the orthogonal demodulation, and the baseband signals are subjected to the phase rotation on the basis of the detection error to thereby realize the frequency correction. According to this method, a feed-back path from the output of the delay detection means to the phase rotation means can be realized as a digital closed loop circuit, which results in that the need for the fine step control of the local oscillator can be eliminated and thus increase in the production cost can be suppressed with a small circuit scale.

Further, since the phase rotation of the phase rotation means can be carried out through complex multiplication based on the above detection error information, the invention can realize high-speed processing and can secure a sufficiently quick response to switching of a plurality of channels in a time division multiplexing system.

The conventional method subjects the signals after the filtering and delay detection to the digital signal processing to realize the frequency correction, on the other hand, the filtering causes removal of desired spectra, which results inevitably in deterioration of the performance.

In the present invention, an AFC circuit having a digital closed loop circuit structure is used so that the phase rotation obtained based on the detection output of the delay detection means is fed back to a preceding stage of the filter means for performing the above filtering operation. As a result, there can be realized such a circuit configuration that the phase error correction is carried out before the filtering and delay detection, and thus such removal of the desired spectra by the filtering as in the conventional system for carrying out the error correction after the filtering and delay detection can be avoided and a high performance can be secured.

DESCRIPTION OF THE PREFERRED EMBODIMENTS

An embodiment of the present invention will be described in detail with reference to the attached drawings.

Figure 1:
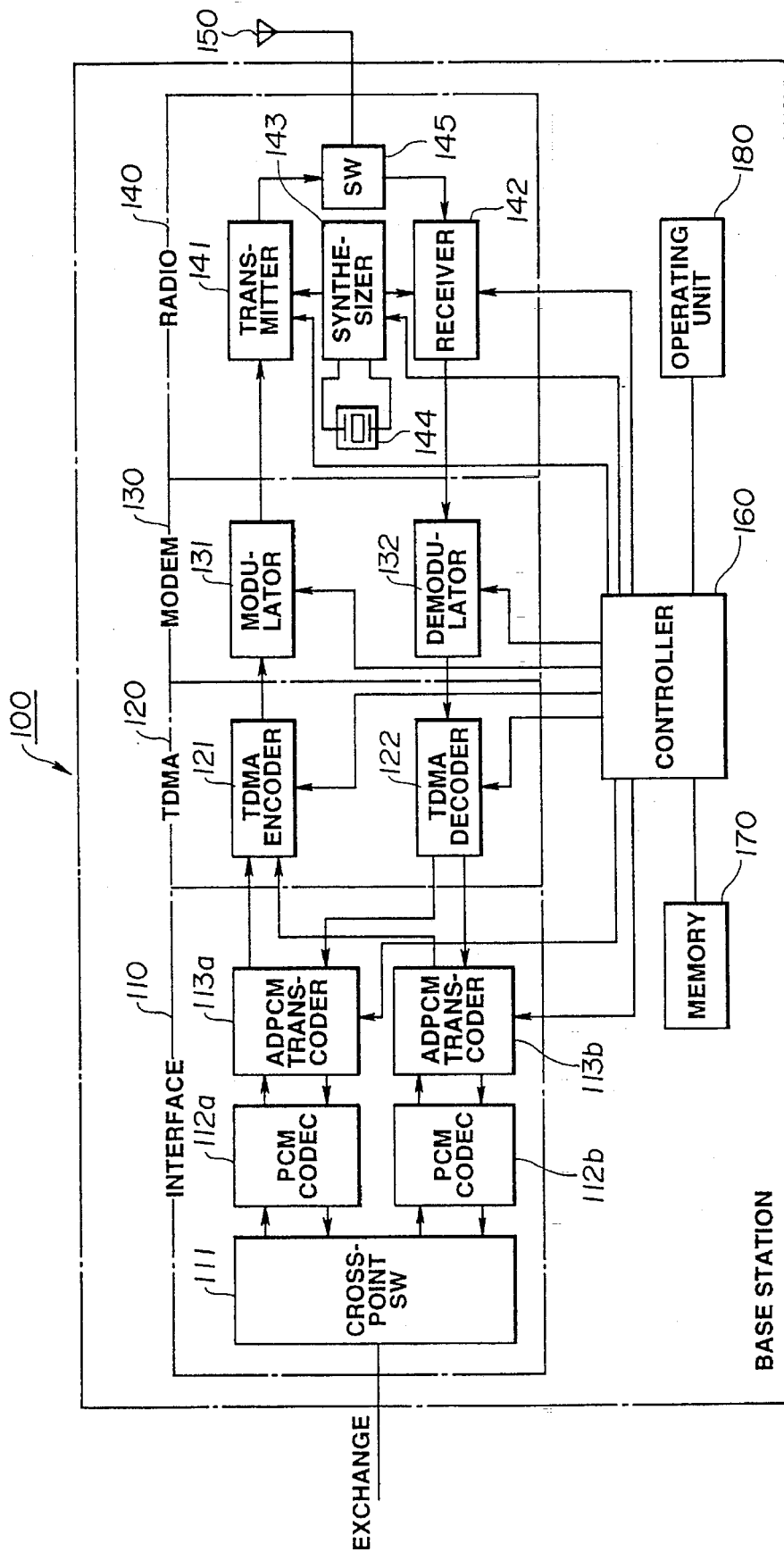
FIG. 1 is a block diagram of a base station of a digital cordless telephone system which employs an AFC circuit in accordance with the present invention.

Referring to FIG. 1, a base station 100 includes an interface section 110 for forming an interface with an exchange, a TDMA section 120 for performing encoding and decoding operations to a time division multiplexing, a modem section 130 for modulating a transmit signal and demodulating a received signal, a radio section 140 for transmitting and receiving the modulated signals, an antenna 150 for transmitting and receiving radio signals, a controller 160 for performing general control over the above-mentioned sections, a memory 170 for storing control data, etc., and an operating unit 180 for inputting various instructions.

The interface section 110 comprises a cross-point switch 111, PCM codecs 112a and 112b, and ADPCM (adaptive differential pulse-code modulation) transcoders 113a and 113b.

The TDMA section 120 comprises a TDMA encoder 121 and a TDMA decoder 122, while the modem section 130 comprises a modulator 131 and a demodulator 132.

The radio section 140 comprises a transmitter 141, a receiver 142, a synthesizer 143, an oscillation source 144 for the synthesizer 143, and an antenna switch 145.

Figure 2:
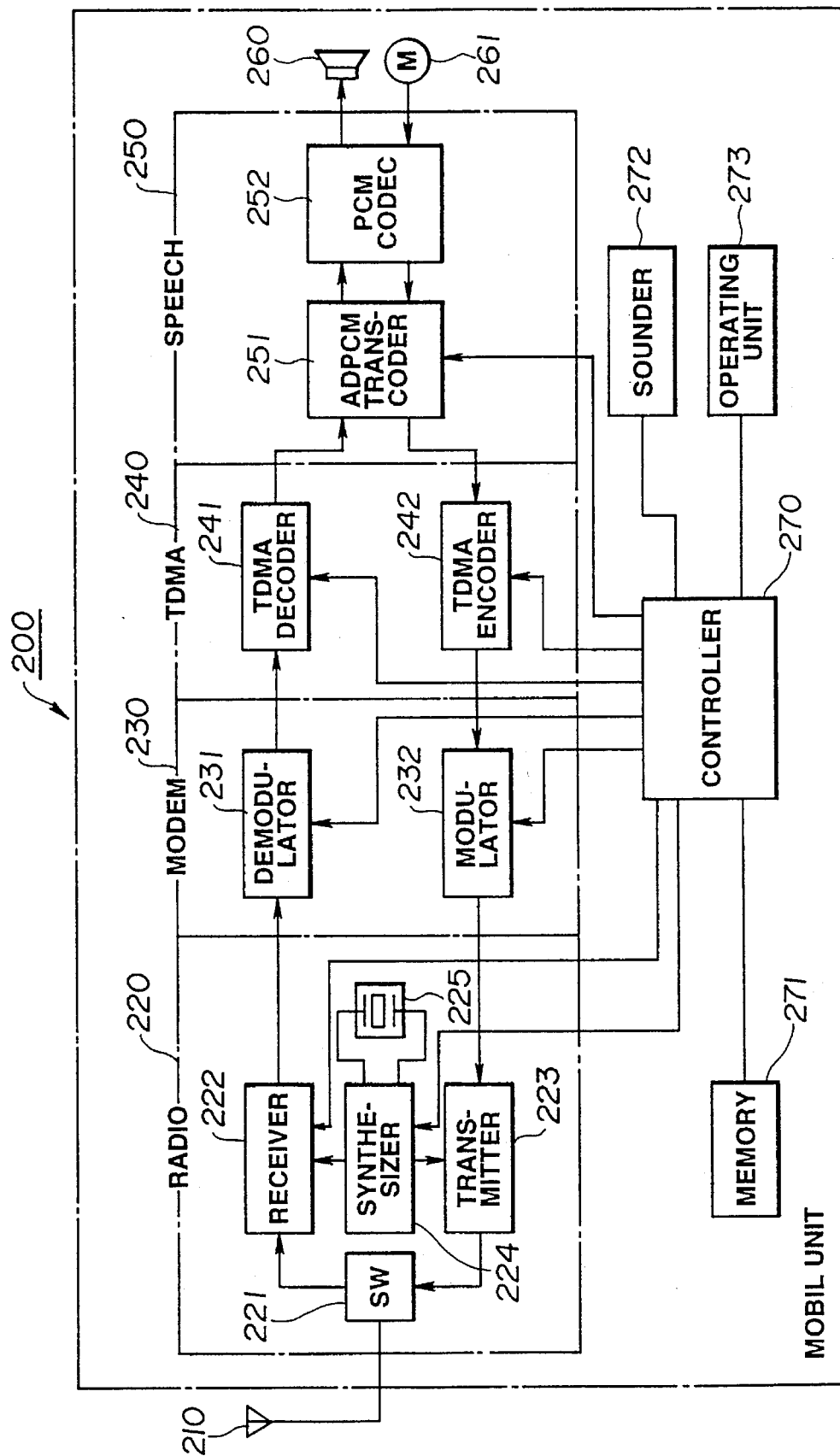
FIG. 2 is a block diagram of a mobile unit of the digital cordless telephone system.

Referring to FIG. 2, a mobile unit 200 includes an antenna 210 for transmitting and receiving radio signals, a radio section 220 for transmitting and receiving the modulated signals, a modem section 230 for modulating a transmit signal and demodulating a received signal, a TDMA section 240 for performing coding and decoding operations for time division multiplexing, a speech section 250 for coding and decoding audio signals, a loudspeaker 260 for reproducing the audio signals, a microphone 261 for collecting speech voice, a controller 270 for performing general control over the above sections, a memory 271 for storing control data, etc., a sounder 272 for sounding a voice information such as reception of a call, and an operation unit 273 for inputting various instructions.

The radio section 220 comprises an antenna switch 221, a receiver 222, a transmitter 223, a synthesizer 224, and an oscillation source 225 for the synthesizer 224.

The modem section 230 comprises a demodulator 231 and a modulator 232, while the TDMA section 240 comprises a TDMA decoder 241 and a TDMA decoder 242. The speech section 250 comprises an ADPCM transcoder 251 and a PCM codec 252.

In the digital cordless telephone system, the base station 100, at the time of communication with the mobile unit 200, receives a modulated signal at the antenna 150, sends it to the receiver 142 through the antenna switch 145, demodulates the received signal at the demodulator 132, and then sends it to the TDMA decoder 122.

Figure 3:
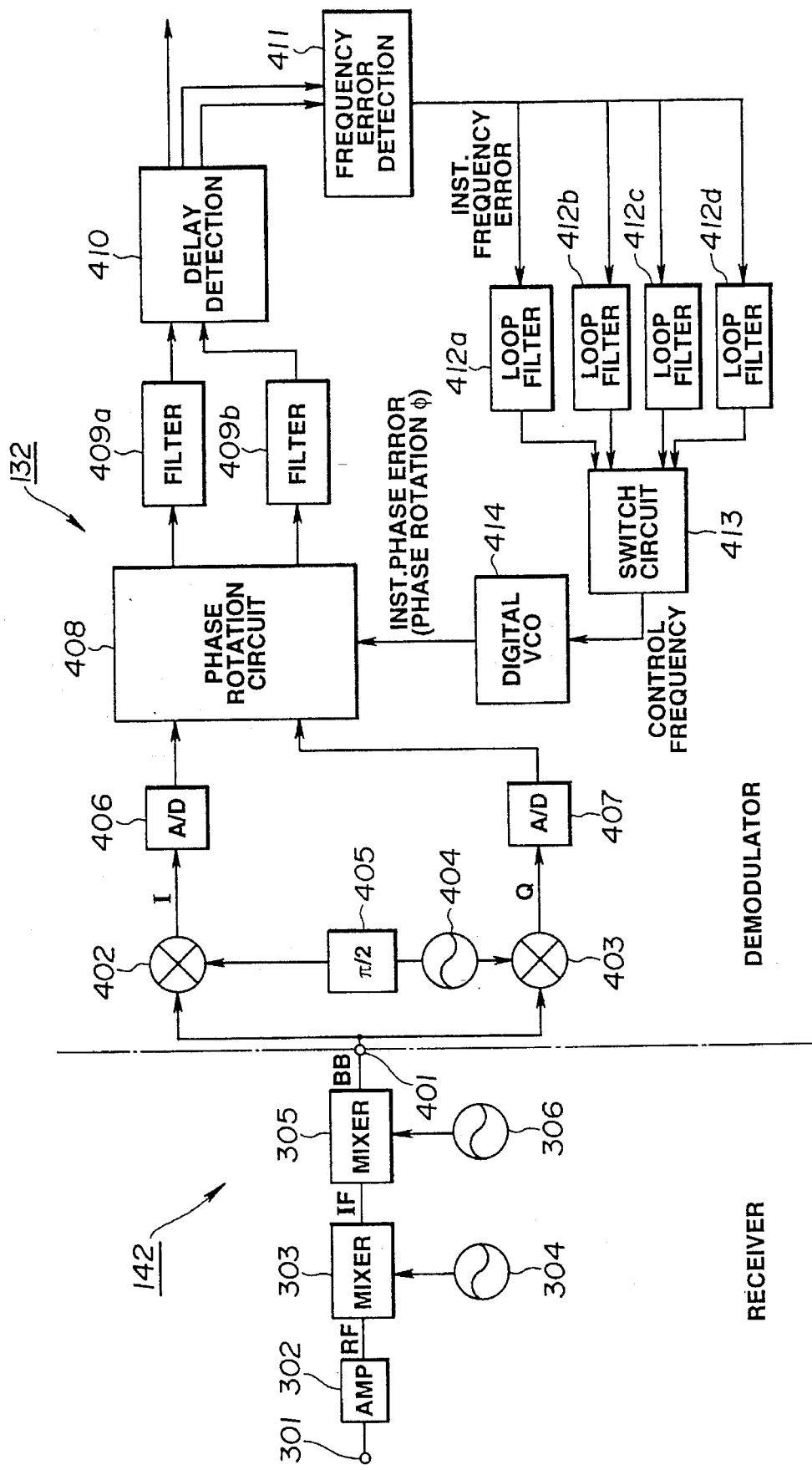
FIG. 3 is a block diagram of a demodulator in the base station of FIG. 1.
Figure 13:
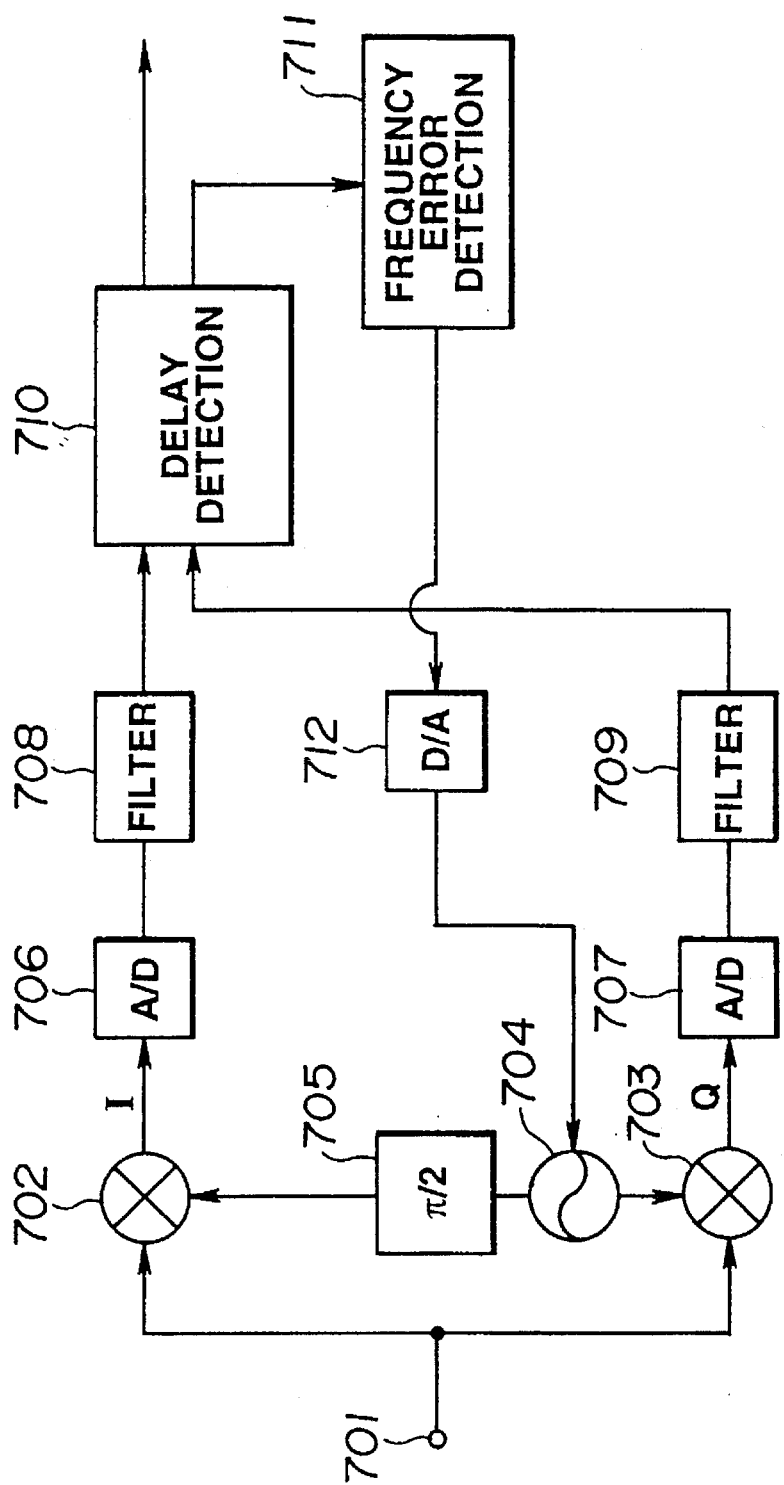
FIG. 13 is a block diagram of a demodulator for a conventional AFC circuit.

FIG. 3 illustrates a structure of the demodulator 132 in the base station 100, together with a major part of the receiver 142 provided at the preceding stage of the demodulator 132. The demodulator 132 is designed to receive, e.g., a ($\pi$/4) shift QPSK signal. In addition to circuits which have substantially the same functions as those in the conventional circuit of FIG. 13, such as mixers 402 and 403, a local oscillator 404, a $\pi$/2phase difference branching filter 405, A/D converters 406 and 407, filters 409a and 409b, and a delay detection. circuit 410, the demodulator 132 includes a phase rotation circuit 408, a frequency error detection circuit 411, loop filters 412a, 412b, 412c and 412d, a switch circuit 413, and a digital voltage control oscillator (VCO) 414.

The phase rotation circuit 408, filters 409a and 409b, delay detection. circuit 410, frequency error detection circuit 411, loop filters 412a, 412b, 412c and 412d, switch circuit 413, and digital VCO 414 constitutes an AFC circuit.

In the illustrated receiver 142 preceding to the demodulator 132, an input signal is supplied through an input terminal 301. The input signal is amplified at an amplifier 302 to obtain a received frequency (RF) signal. The RF signal is sent from the amplifier 302 to a mixer 303 where the signal is frequency-converted into an intermediate frequency (IF) signal with use of a signal received from a local oscillator 304. The RF signal is further sent from the mixer 303 to a mixer 305 where the RF signal is converted to a baseband (BB) signal with use of a signal received from a local oscillator 306.

The mobile unit 200, at the time of communication with the base station 100, receives a modulated signal from the antenna 210, sends it to the receiver 222 via the antenna switch 221, demodulates the received signal at the demodulator 231, and sends it to the TDMA decoder 241.

Figure 4:
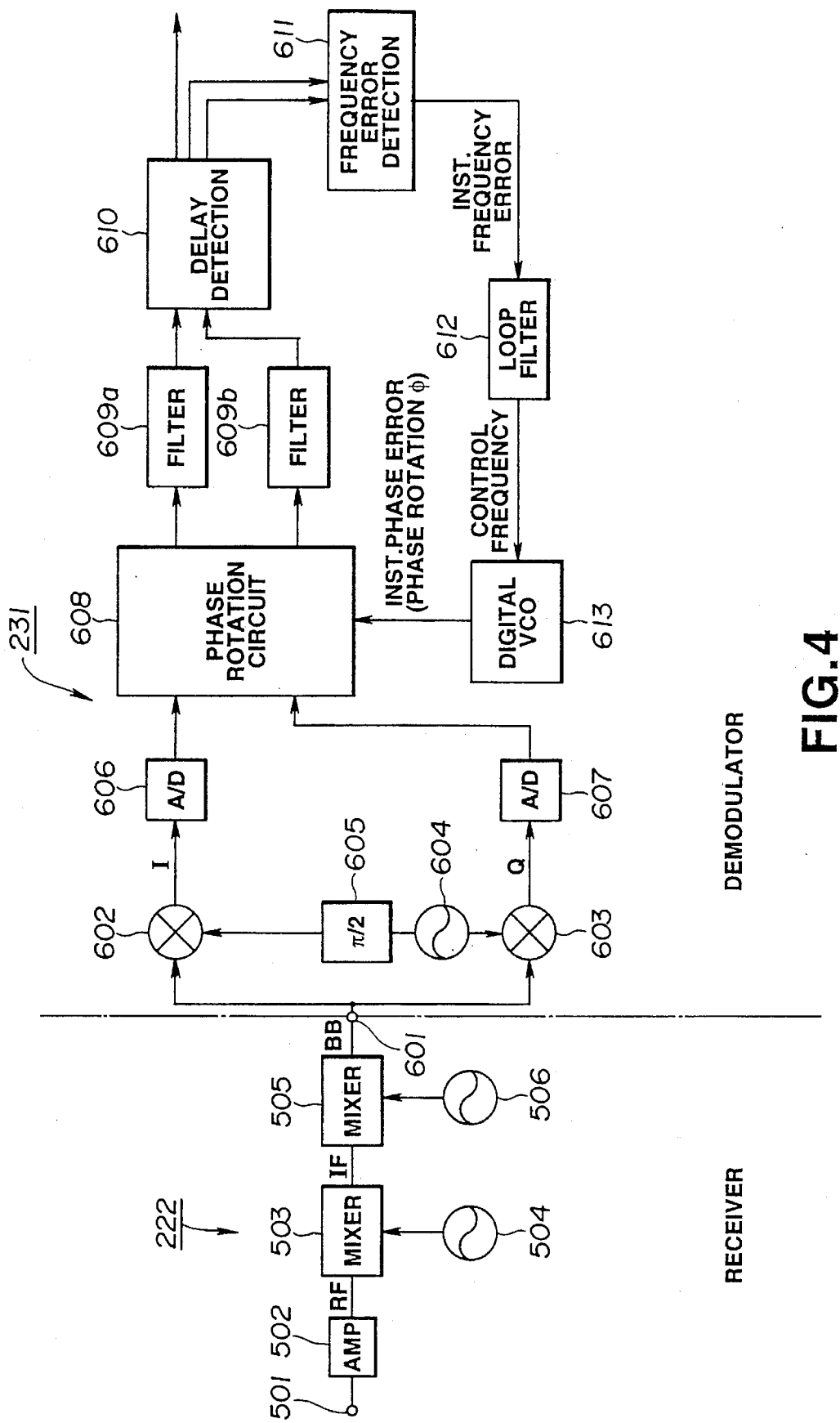
FIG. 4 is a block diagram of a demodulator in the mobile unit of FIG. 2.

FIG. 4 illustrates a structure of the demodulator 231 in the mobile unit 200, together with a major part of the receiver 222 provided at a preceding stage of the demodulator 231. In the illustrated receiver 222 preceding to the demodulator 231, an input signal is supplied through an input terminal 501 and amplified at an amplifier 502 to obtain an amplified received frequency (RF) signal. The RF signal is then frequency-converted at a mixer 503 into an intermediate frequency (IF) signal with use of a signal received from a local oscillator 504. The IF signal is sent further to a mixer 505 where the IF signal is converted to a baseband (BB) signal with use of a signal received from a local oscillator 506.

The arrangement of the demodulator 231 in the mobile unit 200 is substantially the same as that of the demodulator 132 in the base station 100 of FIG. 3, except that a single loop filter 612 is additionally provided. More particularly, the demodulator 231 in the mobile unit 200 includes a phase rotation circuit 608, filters 609a and 609b, a delay detection circuit 610, a frequency error detection circuit 611, a loop filter 612, and a digital VCO 613, which form the AFC circuit.

The major feature of the AFC circuit lies in that the AFC circuit detects a frequency error in a delay detection output signal and performs a frequency correction (phase rotation) to the input signal of the delay detection circuit 610 on the basis of the frequency error. In other words, the AFC circuit is constructed as a closed digital control loop in which a phase rotation $\phi$ generated according to the frequency error is fed back to a preceding stage of the filters 609a and 609b for filtering of the input signal of the delay detection circuit 610. The AFC circuit of the base station 100 of FIG. 3 has the same structure.

Description will now be made as to the frequency control of the digital cordless telephone system in accordance with this embodiment in the signal reception mode with respect to the demodulator 231 of the mobile unit 200 as an example.

Referring to FIG. 4, in the demodulator 231, an input signal (a $\pi$/4shift QPSK signal which is converted into a baseband zone by the receiver 222) is supplied through an input terminal 601. The input signal is then mixed at mixers 602 and 603 with frequency signals having a phase difference of $\pi$/2, one of the frequency signal being directly supplied from a local oscillator 604 and the other being supplied from the local oscillator via a $\pi$/2 phase difference branching filter 605. In this manner, the input signal is subjected to an orthogonal demodulation, thereby to obtain baseband signals I and Q.

Subsequently, the baseband signals I and Q are sent from the mixers 602 and 603 to A/D converters 606 and 607 to be converted to corresponding digital signals, which are then supplied to the phase rotation circuit 608.

Figure 5:
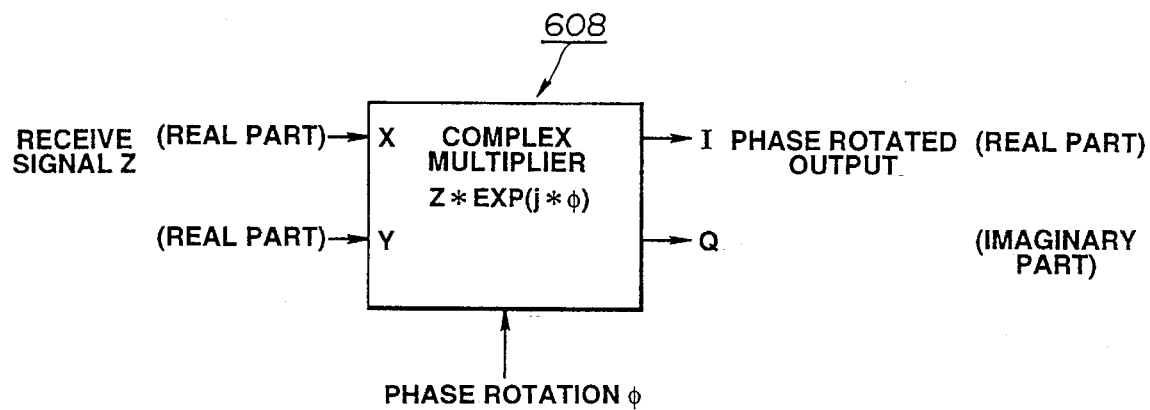
FIG. 5 shows a functional structure of a phase rotation circuit in the demodulator of FIG. 4.

The phase rotation circuit 608 comprises a complex multiplier such as schematically shown in FIG. 5. It performs a complex multiplying operation in accordance with $$Z*EXP(j*\phi)$$

with use of an instantaneous phase value (phase rotation $\phi$) supplied from the digital VCO 613 through a processing (to be explained later), thereby to perform the phase rotation to the baseband signals I and Q on a complex plane.

Figure 6:
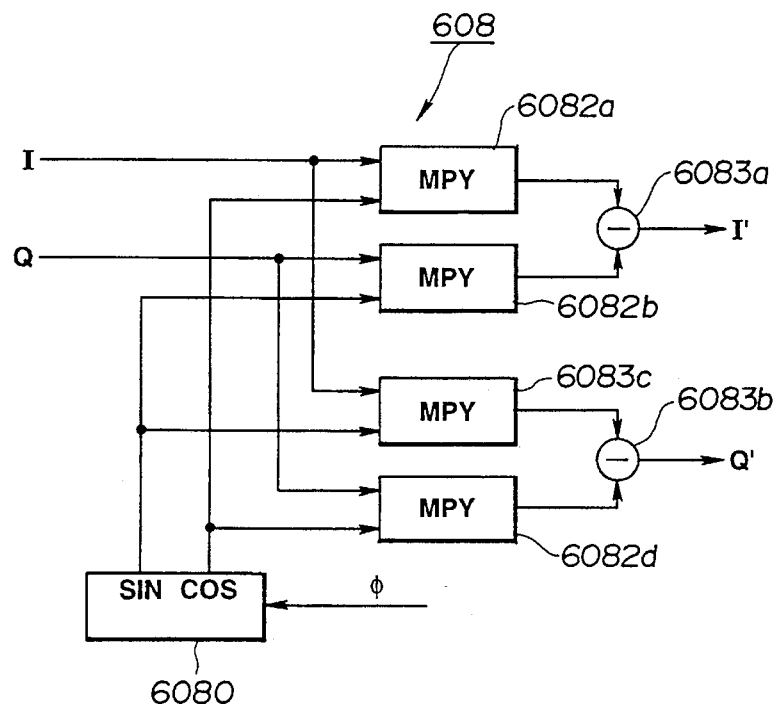
FIG. 6 is an example of the phase rotation circuit in the demodulator of FIG. 4.

Referring to FIG. 6, the phase rotation circuit 608 includes a function generator 6080, multipliers 6082a, 6082b, 6082c and 6082d, a subtractor 6083a, and an adder 6083b. The phase rotation circuit 608 rotates the phase of the baseband signals I and Q by 74 to generate baseband signals I' and Q'. In other words, the phase rotation circuit 608 realizes the following mathematical formula.

$$\begin{bmatrix} \cos\theta & -\sin\theta \\ \sin\theta & \cos\theta \end{bmatrix} \begin{bmatrix} I \\ Q \end{bmatrix} = \begin{bmatrix} I' \\ Q' \end{bmatrix}$$

The function generator 6080 generates functional values of $\sin\theta$ and $\cos\theta$ in accordance with the phase rotation $\phi$ necessary for the frequency error correction generated through the processing (to be explained later).

The multiplier 6082a multiplies the baseband signal I by $\cos\theta$ supplied from the function generator 6080 and the multiplier 6082b multiplies the baseband signal Q by $\sin\theta$ supplied from the function generator 6080. The subtractor 6083a subtracts the multiplication result by the multiplier 6082b from the multiplication result by the multiplier 6082a, thereby to obtain a corrected baseband signal I' by phase rotation.

On the other hand, the multiplier 6082c multiplies the baseband signal I by $\sin\theta$ supplied from the function generator 6080 and the multiplier 6082d multiplies the. baseband signal Q by $\cos\theta$ supplied from the function generator 6080. The adder 6083b adds the multiplication result by the multiplier 6082b to the multiplication result by the multiplier 6082a, thereby to obtain a corrected baseband signal Q' by phase rotation.

The phase rotation φ for use in the phase rotation of the phase rotation circuit 608 is obtained by a digital closed loop circuit constituted by the delay detection circuit 610, frequency error detection circuit 611, loop filter 612, digital VCO 613 and phase rotation circuit 608.

That is, the baseband signals I and Q which are subjected to the phase rotation by the phase rotation circuit 608 in the above-described manner are subjected to filtering by the circuit 610. These filters 609a and 609b may comprise filters of a well known transversal type.

The delay detection circuit 610 then performs a delay detecting operation over the input baseband signals I and Q received from the filters 609a and 609b, sends the detection output to the subsequent stage of the telephone system (such as TDMA decoder 241) and also to the frequency error detection circuit 611.

Figure 7:
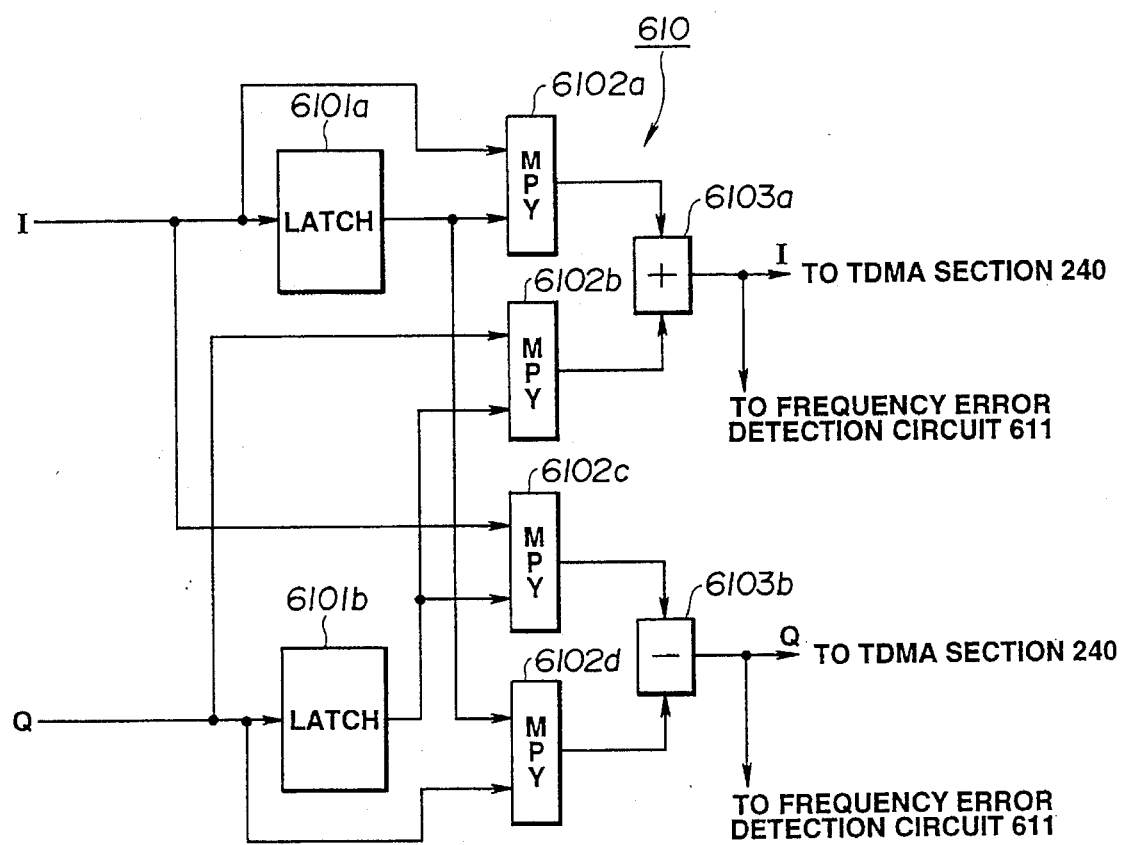
FIG. 7 is an example of a delay detection circuit in the demodulator of FIG. 4.

FIG. 7 illustrates an example of the delay detection circuit 610 which comprises latch circuits 6101a and 6101b, multipliers 6102a, 6102b, 6102c and 6102d, an adder 6103a and a subtractor 6103b.

In the delay detection circuit 610, the multiplier 6102a multiplies an input baseband signal I by the output of the latch circuit 6101a corresponding to a value preceding by one symbol to the baseband signal I and the multiplier 6102b multiplies an input baseband signal Q by the output of the latch circuit 6101b corresponding to a value preceding by one symbol to the baseband signal Q. The results of the multiplication by the multipliers 6102a and 6102b are added to each. other by the adder 6103a, thereby to obtain the baseband signal I as a delay detection output.

The multiplier 6102c multiplies the input baseband signal I by the output of the latch circuit 6101b corresponding to a value preceding by one symbol to the baseband signal Q and the multiplier 6102d multiplies the input baseband signal Q by the output of the latch circuit 6101a corresponding to a value preceding by one symbol to the baseband signal I. The result of the multiplication by the multiplier 6102a is subtracted by the result of the multiplication by the multiplier 6102b, thereby to obtain the baseband signal Q as a delay detection output.

Based on the delay detection output of the delay detection circuit 610, the frequency error detection circuit 611, detects a frequency error from judgement points with respect to each symbol.

The frequency error detection performed by the frequency error detection circuit 611 will be briefly described for a case where a (π/4) shift QPSK modulation signal is subjected to the delay detection.

Figure 8:
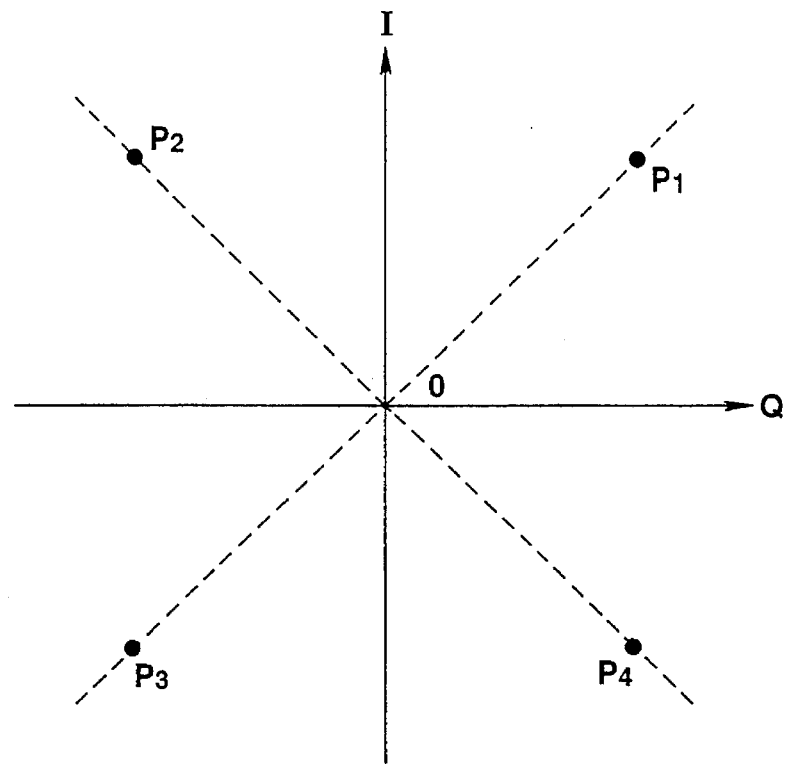
FIG. 8 is a complex coordinate system showing a distribution of phase judgement points for the output of the delay detection circuit in FIG. 4.

In performing the delay detection to the (π/4) shift QPSK modulation signal, the phases of the baseband signals I and Q subjected to the orthogonal demodulation are converged in an ideal situation to one of judgement points P1 to P4 in a complex coordinate system as shown in FIG. 8.

The frequency error detection circuit 611 performs a frequency error detection for each symbol with respect to these judgement points P1 to P4 for each symbol by monitoring, for example, an absolute value |I–Q| of I–Q in each quadrant of the coordinate system. The control direction is determined depending on whether I–Q has a positive value or a negative value.

Figure 9:
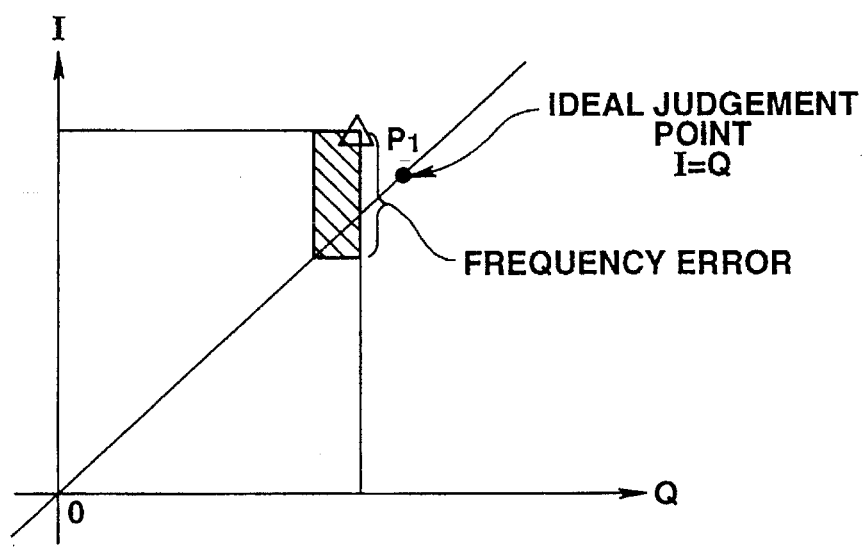
FIG. 9 schematically shows a process performed by a frequency error detection circuit in the demodulator of FIG. 4.

FIG. 9 illustrates an example of an image of a detection frequency error in which the phases are converged to a point and P1 is the ideal judgement point (I=Q) in the first quadrant of the complex coordinate system.

Figure 10:
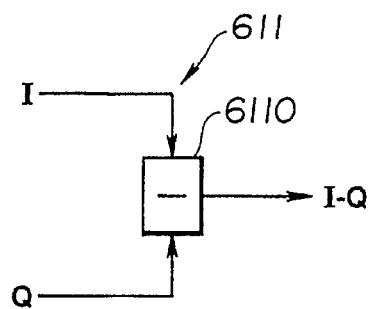
FIG. 10 is an example of the frequency error detection circuit in FIG. 4.

FIG. 10 illustrates an example of a circuit configuration of the frequency error detection circuit 611 which comprises a subtractor 6110 for receiving the detection outputs I and Q from the delay detection circuit 610 and subtracting the signal Q from the signal I.

Figure 11:
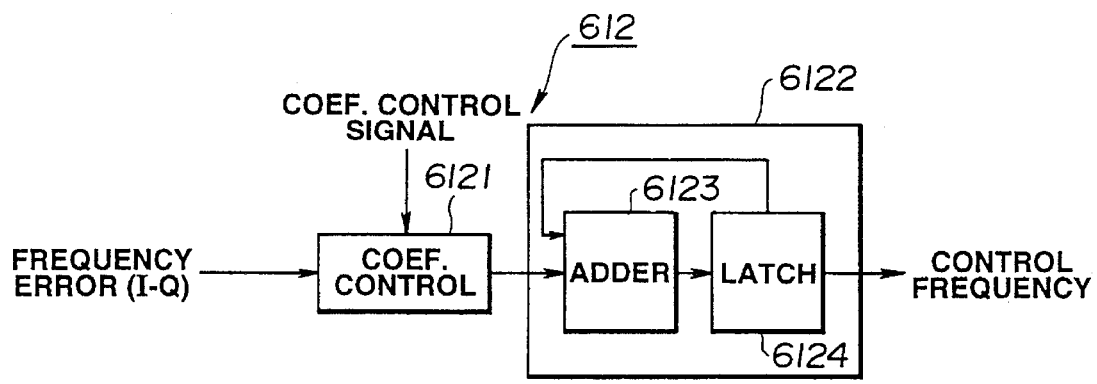
FIG. 11 is an example of a loop filter in the demodulator of FIG. 4.

Instantaneous values of the frequency error detected by the frequency error detection circuit 611 are sequentially supplied to the loop filter 612. The loop filter 612 comprises, for example, a coefficient control circuit 6121 and an accumulator 6122 which comprises an adder 6123 and a latch circuit 6124 as shown in FIG. 11. The coefficient control circuit 6121 multiplies the instantaneous value of the frequency error received from the frequency error detection circuit 611 by a time constant (coefficient control signal) for the smoothing of the instantaneous value. The accumulator 6122 accumulates (i.e., adds) the smoothed output through the adder 6123 and the latch circuit 6124 to thereby obtain a control frequency. With the loop filter 612 having the structure the described above, the control frequency is obtained such as to slowly approach a desired value with a certain time constant.

Figure 12:
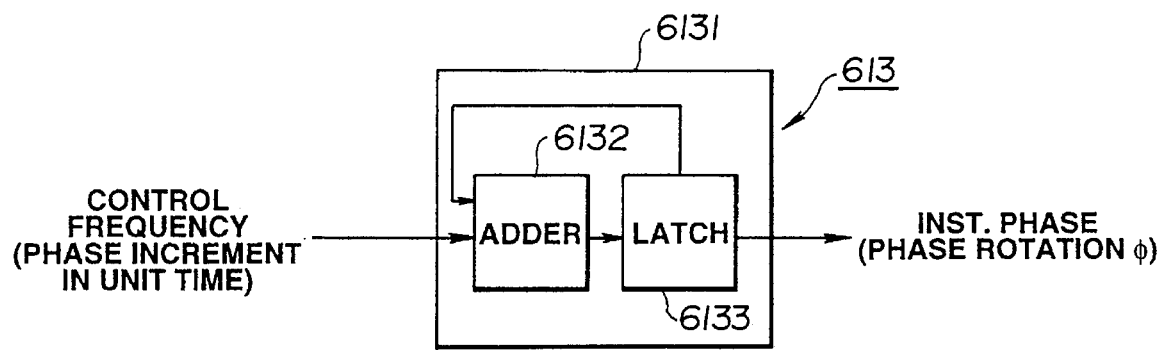
FIG. 12 is an example of a digital VCO circuit in the demodulator of FIG. 4.

The control frequency obtained by the loop filter 612 is then supplied to the digital VCO 613 which comprises an accumulator 6131 including an adder 6132 and a latch circuit 6133 as shown in FIG. 12. The digital VCO 613 accumulates the control frequency (phase increment in unit time) received from the loop filter 612 through the adder 6132 and the latch circuit 6133 to calculate an instantaneous phase value (phase rotation φ) and supplies the phase rotation φ to the phase rotation circuit 608.

The phase rotation circuit 608 having the complex multiplying function performs a complex multiplication in accordance with $$Z*EXP(j*n)$$

thereby to perform phase rotation to the baseband signals which are subjected to the orthogonal demodulation in the complex plane and thereby to correct the frequency error.

Although description has been made as to the frequency control of the demodulator 231 in the mobile unit 200 of the digital cordless telephone system in the foregoing, the operation of the demodulator 132 in the base station 100 of the telephone system is substantially the same as that in the mobile unit 200. In the AFC circuit of the base station 100, however, the 4 loop filters 412a, 412b, 412c and 412d are provided through the switch circuit 413 between the frequency error detection circuit 411 and digital VCO 414 as shown in FIG. 3.

With the base station 100 having such an arrangement as mentioned above, the outputs of the loop filters 412a, 412b, 412c and 412d are switched by the switch circuit 413 and supplied to the digital VCO 414 to realize the frequency error correction corresponding to a multiplexing number of 4. The frequency control of the base station 100 is exactly the same as that of the mobile unit 200 except for the switching operation necessary for the time division multiplexing operation.

As described above, in accordance with the present invention, the frequency error correction is performed by means of the phase rotation in which the timing of the phase rotation is after the orthogonal demodulation and before the filtering/delay detection. The AFC circuit of the above-described arrangement in which the frequency error correction is carried out by means of the phase rotation, the circuit scale can be made small and the production cost can be reduced when compared with the fine step control of the local transmitter based on analog signal.

Further, since the error correction is carried out before the filtering/delay detection, desired spectra are not filtered out. Therefore, the performance of the AFC circuit cannot be degraded. In addition, by employing the phase rotation which allows a high-speed processing for the error correction, sufficiently high-speed response can be secured to frequency switching for each channel in the time division multiplexing system.

In a modification of the present invention, the filters 609 provided upstream of the delay detection circuit may be removed with substantially the same effect of the AFC of the above-described embodiment. Further, the AFC circuit may be constituted by circuits all operative by digital signals. In addition, the present invention may be modified in various ways and used in various applications without departing from the subject matter of the invention.

What is claimed is:

1. An AFC circuit for use in a receive demodulator for receiving a multi-value phase modulation signal for each of a plurality of time division multiplex radio channels, performing an orthogonal demodulation to the multi-value phase modulation signal and detecting original modulation multi-value information from baseband signals after being subjected to the orthogonal demodulation, the AFC circuit comprising:

phase rotation means for performing a phase rotation to each of the baseband signals obtained by the orthogonal demodulation for each of the radio channels;

delay detection means for performing a delay detection to the baseband signals after being subjected to the phase rotation;

frequency error detection means for detecting a frequency error from a delay detection pattern by the delay detection means;

a plurality of loop filter means for receiving the frequency error detected by the frequency error detection means and generating a control frequency from the frequency error;

switching means for selectively switching output of each of the plurality of loop filter means at a time division multiplex timing of each of the radio channels; and variable frequency oscillation means for accumulating the control frequency selectively switched by the switching means and supplying the accumulated control frequency to the phase rotation means as an instantaneous phase value for the phase rotation of the baseband signals.

2. An AFC circuit as set forth in claim 1, wherein the phase rotation means, the delay detection means, the frequency error detection means, the loop filter means and the variable frequency oscillation means collectively form a digital closed loop circuit.

3. An AFC circuit as set forth in claim 1, wherein the frequency error detection means comprises detection means for detecting as the frequency error a difference between the two orthogonal baseband signals subjected to the delay detection.

4. An AFC circuit as set forth in claim 1, wherein at least one of the loop filter means comprises a coefficient control circuit for providing a time constant by multiplying the frequency error by a predetermined coefficient and an accumulator for accumulating an output of the coefficient control circuit.

5. A time division multiplex radio communication system comprising a base station and a mobile station each having a receive demodulator for receiving a multi-value phase modulation signal for each of a plurality of time division multiplex radio channels, performing an orthogonal demodulation to the multi-value phase modulation signal and detecting original modulation multi-value information from baseband signals after being subjected to the orthogonal demodulation, wherein the receive demodulator in the base station includes an AFC circuit which comprises:

phase rotation means for performing a phase rotation to each of the baseband signals obtained by the orthogonal demodulation for each of the radio channels;

delay detection means for performing a delay detection to the baseband signals having been subjected to the phase rotation;

frequency error detection means for detecting a frequency error from a delay detection pattern by the delay detection means;

a plurality of loop filter means for receiving the frequency error detected by the frequency error detection means and generating a control frequency from the frequency error;

switching means for selectively switching output of each of the plurality of loop filter means at a timing of each of the radio channels; and variable frequency oscillation means for accumulating the control frequency selectively switched by the switching means and supplying the accumulated control frequency to the phase rotation means as an instantaneous phase value for the phase rotation of the baseband signals, and wherein the receive demodulator in the mobile station includes an AFC circuit which comprises:

phase rotation means for performing a phase rotation to the baseband signals obtained by the orthogonal demodulation;

delay detection means for performing a delay detection to the baseband signals having been subjected to the phase rotation;

frequency error detection means for detecting a frequency error from a delay detection pattern by the delay detection means;

loop filter means for receiving the frequency error and generating a control frequency from the frequency error; and variable frequency oscillation means for accumulating the control frequency and supplying the accumulated control frequency to the phase rotation means as an instantaneous phase value for the phase rotation of the baseband signals.

* * * * *